United States Patent
Liu

(10) Patent No.: US 6,643,133 B1
(45) Date of Patent: Nov. 4, 2003

(54) BUCKLING DEVICE OF A HEAT DISSIPATING MODULE

(76) Inventor: Jefferson Liu, No. 13-8, Shuiching Lane, Shuiching, Peitun, Taichung (TW)

(*) Notice: Subject to any disclaimer, the term of this patent is extended or adjusted under 35 U.S.C. 154(b) by 0 days.

(21) Appl. No.: 10/305,725

(22) Filed: Nov. 26, 2002

(30) Foreign Application Priority Data

Aug. 13, 2002 (TW) ................................. 91212527 U

(51) Int. Cl.7 .............................................. H05K 7/20
(52) U.S. Cl. ........................ 361/704; 24/457; 24/458; 165/80.3; 165/185; 248/510; 257/718; 257/719; 361/710; 361/719
(58) Field of Search ................. 24/457, 458; 165/80.3, 165/104.33, 185; 174/16.3; 248/505, 510, 316.7; 257/706–707, 712–715, 726–727; 361/690, 697, 704–710, 719–721

(56) References Cited

U.S. PATENT DOCUMENTS

| 6,181,559 B1 | * | 1/2001 | Seo | 361/704 |
| 6,419,008 B1 | * | 7/2002 | Wu | 165/80.3 |
| 6,449,152 B1 | * | 9/2002 | Lin | 361/710 |
| 6,450,248 B1 | * | 9/2002 | Chang | 361/710 |
| 6,466,443 B1 | * | 10/2002 | Chen | 257/719 |

* cited by examiner

*Primary Examiner*—Gregory Thompson
(74) *Attorney, Agent, or Firm*—Pro-Techtor International Services

(57) ABSTRACT

A buckling device of a heat dissipating module comprises a retaining seat, a connecting element and a pressing element. The retaining seat has a plurality of legs extended from two opposite sides, each leg having a buckling hole. The connecting element has a plurality of extending arms at two opposite sides, an end portion of each extending arm being installed with a hook. The pressing element has a slot and a protrusion at first end, and second end of the pressing element being pivotally connected to the slot of the connecting element; and when rotating the pressing element, the lower side of the protrusion moving upwards or downwards.

3 Claims, 5 Drawing Sheets

BUCKLING DEVICE OF A HEAT DISSIPATING MODULE

FIELD OF THE INVENTION

The present invention relates to heat dissipating devices for electronic device, and particularly to buckling device of a heat dissipating module which has a larger area for dissipating heat.

BACKGROUND OF THE INVENTION

Currently, the heat dissipating device of a computer CPU or heat dissipating elements in electronic elements has a base with aluminum extrusion dissipating fins for absorbing heat and transferring the heat to the fins. Then fans blow out heat in the fin.

To have a high efficiency, at least two heat dissipating seats are assembled together as a heat dissipating module and then the heat dissipating module is in contact with the CPU or heat dissipating fins. Thereby, by the heat dissipating module, more heat can be absorbed from the heat source.

In the prior art, a lower heat dissipating base is formed with a plurality of slots transversally through the fins. Then the long buckles are placed in the slots. Then the upper heat dissipating base is coupled to the lower heat dissipating fins so as to form a heat dissipating module. The buckles have buckling holes for being fixed to the CPU or other heat dissipating device. A plurality of heatpipes are connected between the upper heat dissipating piece and lower heat dissipating piece, and thus heat can be transferred quickly.

In above-mentioned prior art design; the slots are formed on the lower heat-dissipating base, which contacts the heat source directly. As a result the area of the lower heat dissipating base to contact the heat source is reduced greatly and consequently, the heat dissipating efficiency is low.

Moreover, the heat dissipating base is formed with a plurality of slots, the working process is tedious and complicated.

SUMMARY OF THE INVENTION

Accordingly, the primary object of the present invention is to provide a buckling device of a heat dissipating module comprising a retaining seat, a connecting element and a pressing element. The retaining seat has a plurality of legs extended from two opposite sides, each leg having a buckling hole. The connecting element has a plurality of extending arms at two opposite sides, an end portion of each extending arm being installed with a hook; the connecting element having a slot. One side of the end of the pressing element having a protrusion, and another side of the end of the pressing element being pivotally connected to the slot of the connecting element; and when rotating the pressing element, a lower side of the protrusion moving upwards or downwards.

The various objects and advantages of the present invention will be more readily understood from the following detailed description when read in conjunction with the appended drawing.

DETAILED DESCRIPTION OF THE PREFERRED EMBODIMENTS

Figure 1:
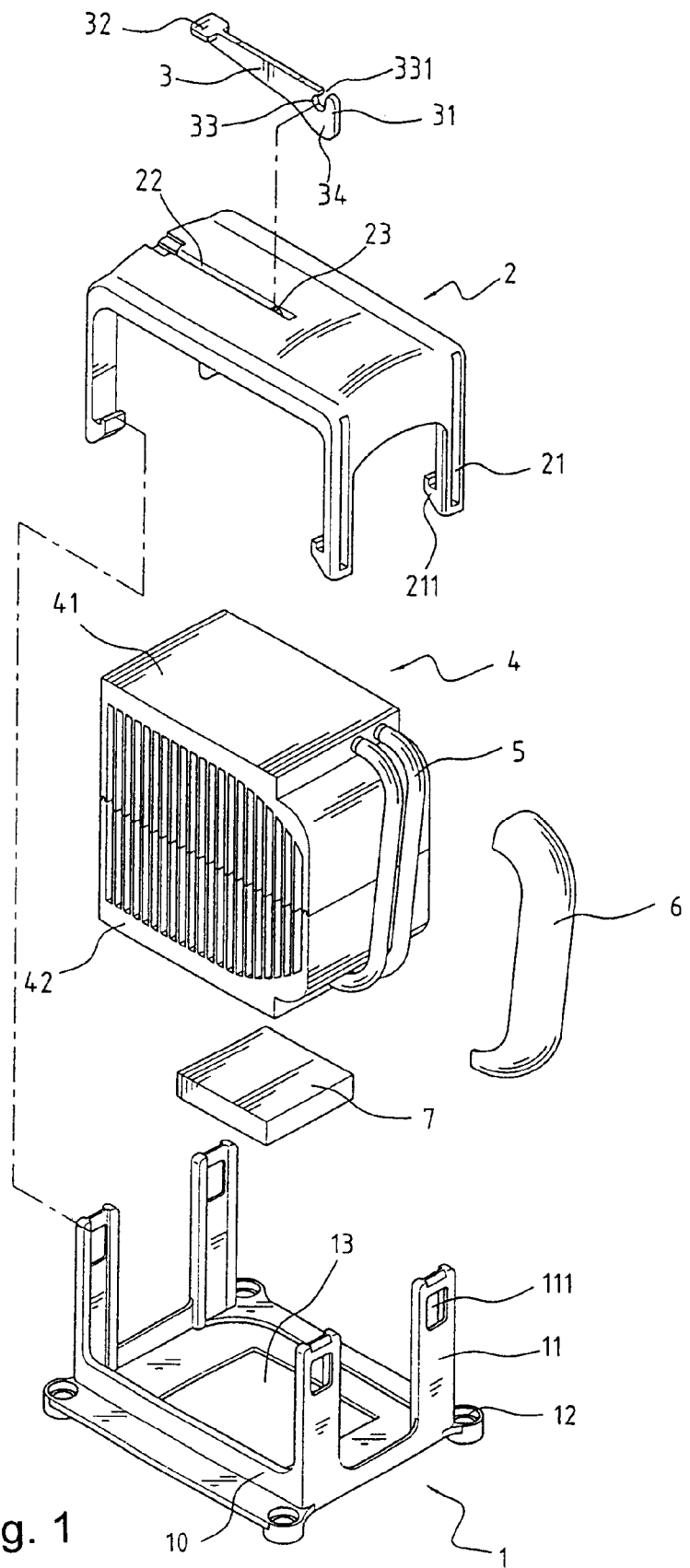
FIG. 1 is an exploded perspective view of the elements of the present invention.

Referring to FIG. 1, the buckling device of a heat dissipating module of the present invention is illustrated. The buckling device includes a retaining seat 1, a connecting element 2, and a pressing element 3. The retaining seat 1 serves to fix to a circuit board of a mainframe and for carrying a heat dissipating module 4. The connecting element 2 is connected to the retaining seat 1. The pressing element 3 is installed to the connecting element 2 so that the pressing element 3 resists against the heat dissipating module 4. Thereby, the heat dissipating module 4 is fixed to the retaining seat 1 and the connecting element 2.

In FIG. 1, it is illustrated that the retaining seat 1 has a seat body 10. Four of legs 11 are extended from the seat body 10 of the retaining seat 1 An end portion of each leg 11 has a buckling hole 111. A center of the seat body 10 is installed with a through hole 13. Four corners of the seat body 10 is installed with holes 12. The retaining seat 1 can be locked to a motherboard (not shown) by using screws or other retainers (not shown) to passing through the holes 12. Moreover, the CPU 7 or other heat source of the motherboard passes through the through hole 13.

The connecting element 2 is like a mask. The connecting element 2 has extending arms 21 at two opposite sides. The end portion of each extending arm 21 has a hook 211. A horizontal portion of the connecting element 2 has a slot 22. The slot 22 has an axial rod 23 therein.

Figure 2:
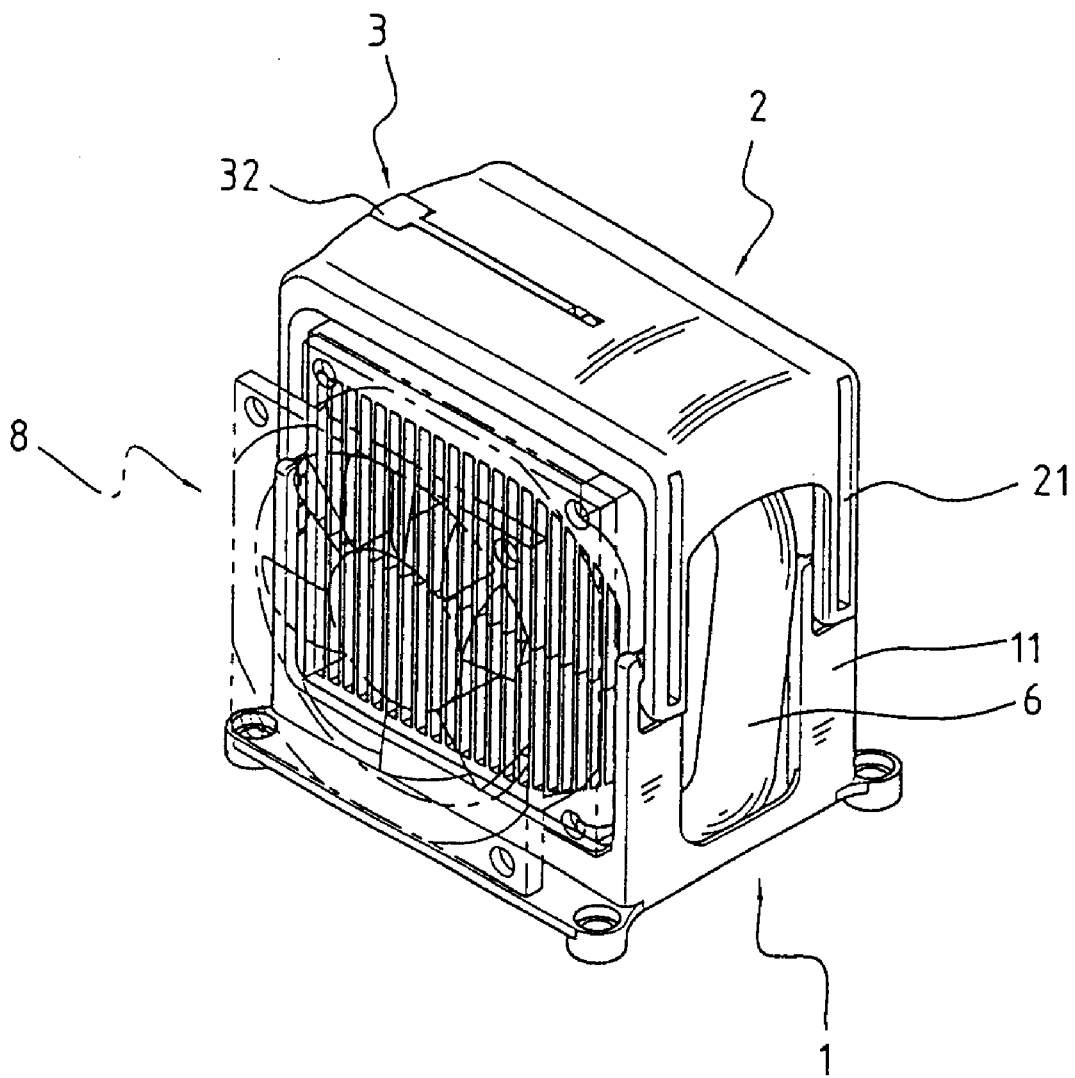
FIG. 2 is a perspective view showing that the present invention is assembled.
Figure 3:
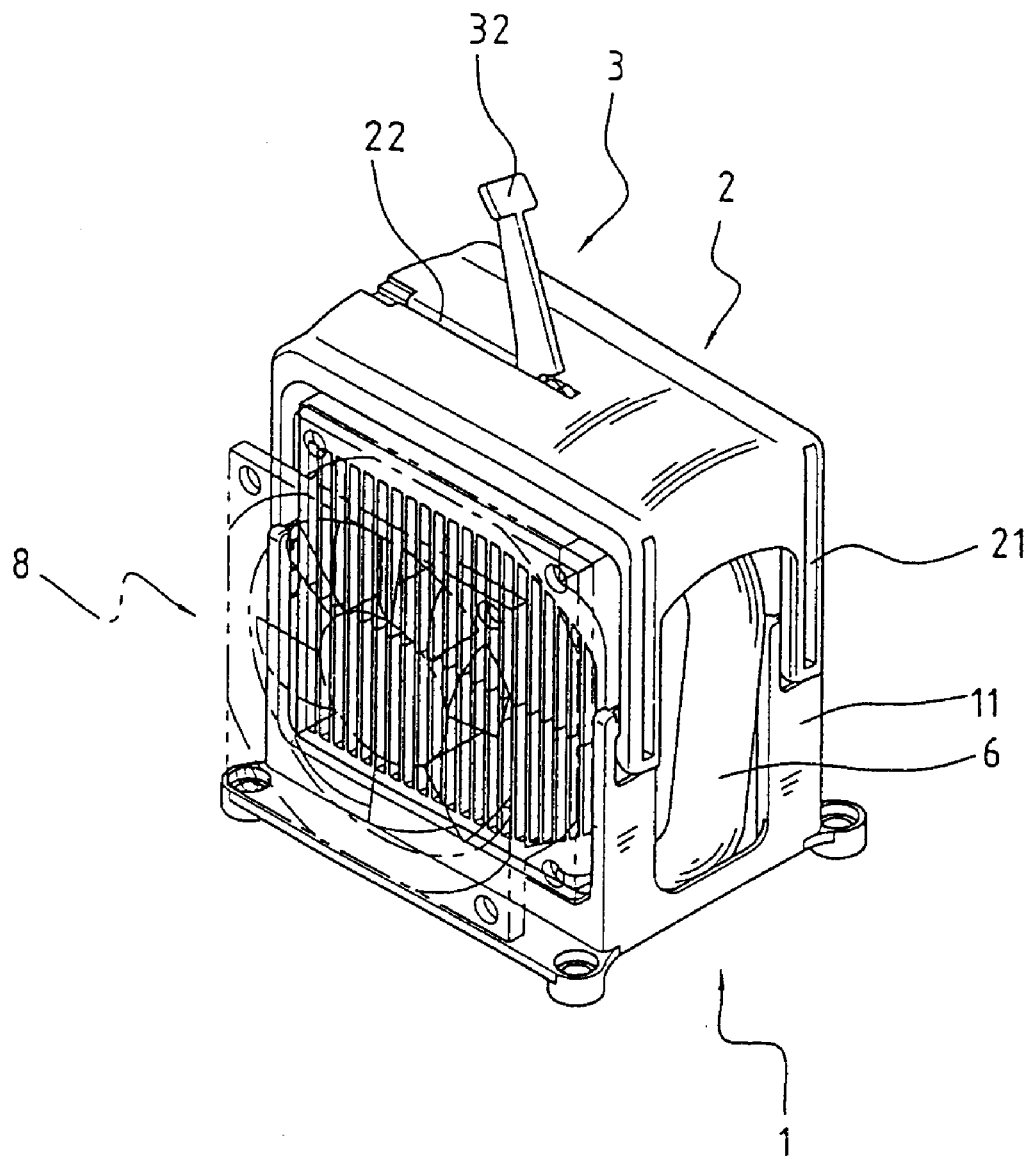
FIG. 3 is a perspective view showing that the pressing element of the present invention rotates upwards.
Figure 4:
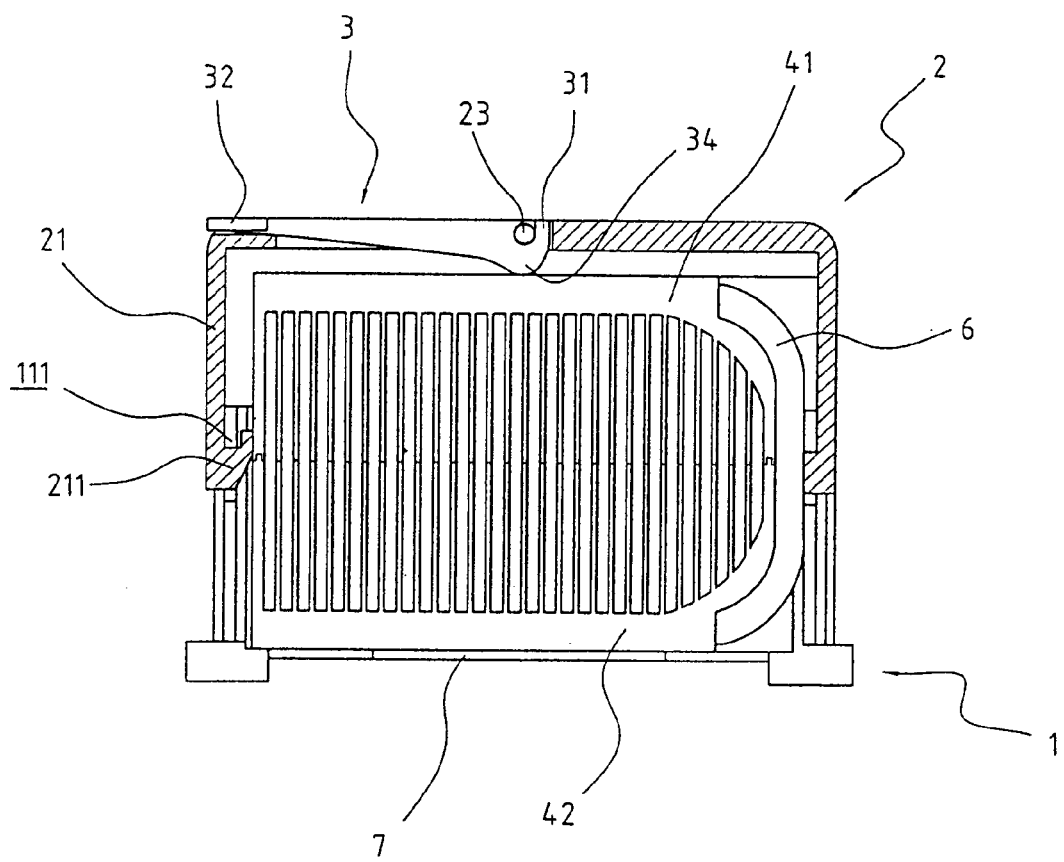
FIG. 4 shows a plane view in that a structure of the present invention in that the present invention has been assembled and the pressing element tightly resists against the heat dissipating module.
Figure 5:
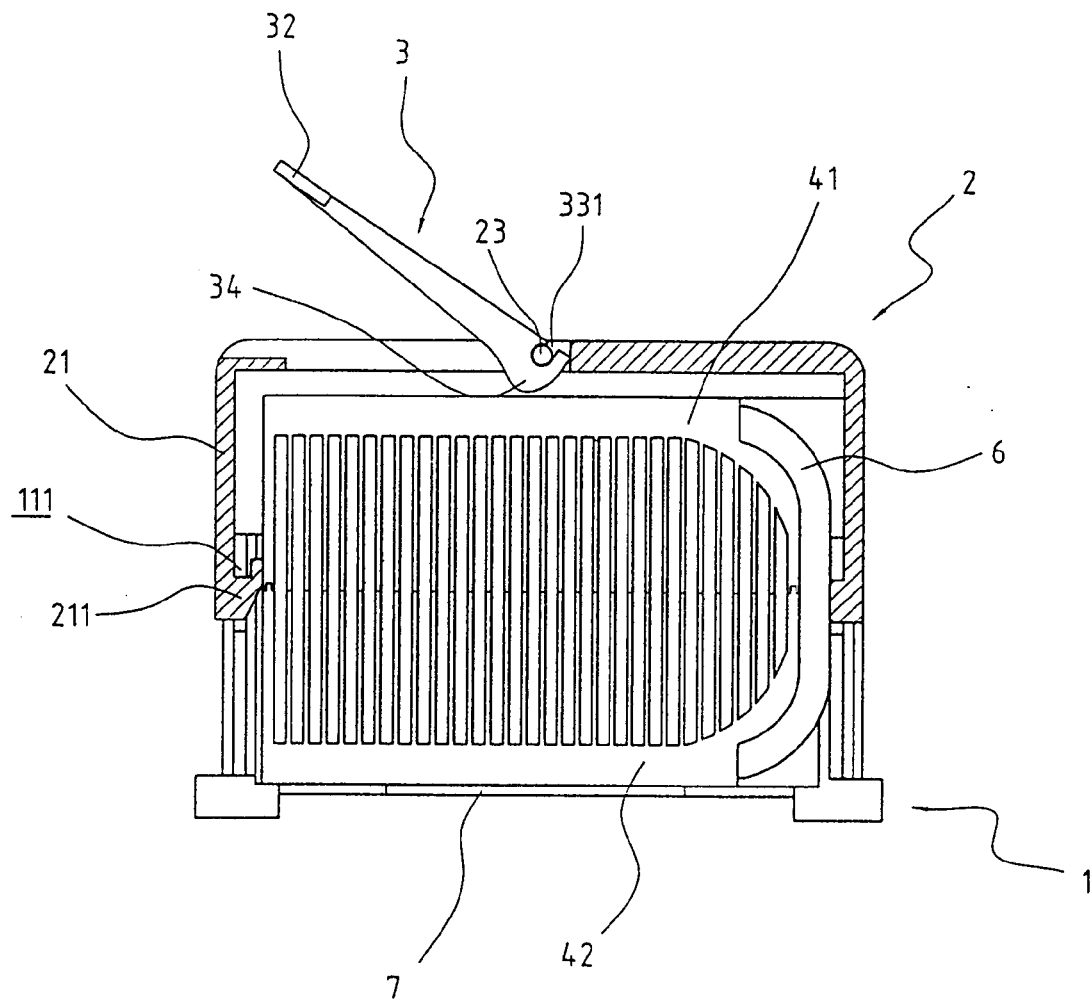
FIG. 5 is a plane view showing that the pressing element of the present invention rotates upwards.

The pressing element 3 has two opposite ends, the first end 31 and the second end 32. One side of the first end 31 has a protrusion 34 and another side of the first end 31 has a pivotal hole 33. An inner diameter of the pivotal hole 33 is approximately equal to a diameter of the axial rod 23. A lateral side of the pivotal hole 33 is installed with an opening 331. The width of the opening 331 is slightly smaller than the diameter of the axial rod 23 and the inner diameter of the pivotal hole 33. A finger can press the second end 32. The whole width of the pressing element 3 is smaller than the width of the slot 22. The pressing element 3 is received in the slot 22. In the present invention, the axial rod 32 passes through the opening 331 of the pressing element 3 in force so that the axial hole 23 enters into the pivotal hole 33 to complete the connection. Further, the pressing element 3 rotates with respect to the connecting element 2 by using the axial rod 23 as a rotating center. The opening 331 faces upwards so as to axially connect the pivotal hole 33 with the axial rod 23, and thus the protrusion 34 faces downwards. By operating the pressing element 3 to rotate upwards or downwards, the arrangement of the protrusion 34 will change. In other words, when the pressing element 3 rotates upwards, a lower end of the protrusion 34 will lift upwards (referring to FIGS. 3 and 5). When the pressing element 3 rotates downwards, the lower end of the protrusion 34 will descends (referring to FIGS. 2 and 4).

In assembly the heat dissipating module 4 of the present invention, as shown in the FIG. 1, the fins of the upper and lower heat dissipating pieces 41, 42 are assembled together.

A plurality of heatpipes 5 are connected between the bases of the upper and lower heat dissipating pieces 41,42 for enhancing the heat dissipating effect of the heat dissipating module 4. A protecting mask 6 for avoiding to be destroyed due to collision covers an external of heatpipes 5. When the retaining seat 1 is assembled to a motherboard and heat sources, such as CPU 7, is exposed out of the through hole 13, the hooks 211 of the extending arms 21 of the connecting element 2 are buckled to the buckling holes 111 of the legs 11 of the retaining seat 1. Moreover, the lower heat dissipating piece 42 is in contact with a surface of the CPU 7. Finally, the pressing element 3 is rotated downwards so that the outlook of the protrusion 34 descends to press an upper surface of the heat dissipating module 4 (referring to FIG. 4), as a result a downward force is applied to the heat dissipating module 4 and thus is fixed. A lateral of the heat dissipating module 4 can be assembled to a heat dissipating fan 8. The fan 8 blows cold air into the heat dissipating module 4 for heat dissipation. When it is desired to detach the heat dissipating module 4, it is only necessary to rotate the pressing element 3 upwards so that the protrusion 34 separates from the heat dissipating module 4. Then the hook 211 is pushed to make the elastic extending arms 21 swings through a proper angle. Thus, the hook 211 separates from the buckling hole 111. Thereby, the connecting element 2 separates from the retaining seat 1. Then the heat dissipating module 4 can be taken out.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A buckling device of a heat dissipating module comprising:

a retaining seat having a plurality of legs extended from two opposite sides, each leg having a buckling hole;

a connecting element having a plurality of extending arms at two opposite sides, an end portion of each extending arm having a hook at an end thereof; the connecting element having a slot; and a pressing element having a protrusion at a first end, and a second end of the pressing element being pivotally connected in the slot of the connecting element; such that when said pressing element is rotated downward, said pressing element contacts a surface of the heat dissipating module to urge said connecting element upward, thereby locking the hooks in the buckling holes.

2. The buckling device of a heat dissipating module of claim 1, wherein the number of legs on each side of the retaining seat is two, and the number of extending arms on each side of the connecting element is two.

3. The buckling device of a heat dissipating module of claim 1, wherein the slot has an axial rod; the pressing element has a pivotal hole at the first end; a lateral side of the pivotal hole has an opening whose width is slightly smaller than the diameter of the axial rod and an inner diameter of the pivotal hole; the axial rod passes through the opening and then enters into the pivotal hole so as to pivotally connect the pressing element with the axial rod.

* * * * *